US006777973B2

(12) United States Patent
Morishita

(10) Patent No.: US 6,777,973 B2
(45) Date of Patent: Aug. 17, 2004

(54) LIQUID CRYSTAL DISPLAY DEVICE AND ITS TESTING METHOD

(75) Inventor: Hitoshi Morishita, Kumamoto (JP)

(73) Assignee: Kabushiki Kaisha Advanced Display, Kumamoto (JP)

( * ) Notice: Subject to any disclaimer, the term of this patent is extended or adjusted under 35 U.S.C. 154(b) by 0 days.

(21) Appl. No.: 10/309,340

(22) Filed: Dec. 4, 2002

(65) Prior Publication Data

US 2003/0155943 A1 Aug. 21, 2003

(30) Foreign Application Priority Data

Dec. 4, 2001 (JP) .................................... P2001-370384

(51) Int. Cl.[7] .............................................. G01R 31/00
(52) U.S. Cl. ...................... 324/770; 324/158.1; 349/37; 349/42
(58) Field of Search ............................ 324/73.1, 158.1, 324/500, 765, 770; 345/30, 32, 55, 204–206; 349/33, 37, 40–42, 48, 54; 438/14, 17, 18

(56) References Cited

U.S. PATENT DOCUMENTS 5,185,601 A * 2/1993 Takeda et al. ................ 349/39
5,585,666 A * 12/1996 Imamura .................... 257/668
5,949,502 A * 9/1999 Matsunaga et al. ........... 349/40

FOREIGN PATENT DOCUMENTS

JP 9-26591 1/1997

* cited by examiner

*Primary Examiner*—Minh N. Tang
(74) *Attorney, Agent, or Firm*—McDermott Will & Emery LLP

(57) ABSTRACT

A cross line is formed on the surface of the peripheral portion of an electrode substrate so as to cross a source line array with a gate insulating film interposed in between. If a display failure such as a line defect is found in a dynamic operating inspection that is performed after mounting of a driver LSI, a crossing portion of the cross line and a source line as a failure occurring position is irradiated with YAG laser light, whereby the source line concerned and the cross line are connected to each other. Then, an output waveform of the driver LSI is measured by contacting a prober that is connected to an oscilloscope into contact with a cross line electrode.

15 Claims, 5 Drawing Sheets

LIQUID CRYSTAL DISPLAY DEVICE AND ITS TESTING METHOD

BACKGROUND OF THE INVENTION

1. Field of the Invention

The present invention relates to a liquid crystal display device that is manufactured by using the COG method in which driver ICs are mounted on the peripheral portion of one of two insulative substrates that are opposed to each other with a liquid crystal layer interposed in between, as well as to a testing method of such a liquid crystal display device.

2. Description of the Related Art

With the progress of the highly information-oriented society, great advances are being made in the field of liquid crystal display devices. To spread liquid crystal display devices further, it is now important to decrease their prices by improving their productivity.

In conventional liquid crystal display devices, a driver LSI for driving the switching elements of pixels is provided in the form of a TCP (tape carrier package) and is connected, via an ACF (anisotropic conductive film), to electrode terminals formed on the surface of the peripheral portion of one of two insulative substrates that are opposed to each other with a liquid crystal layer interposed in between. The TCP is such that a driver LSI having Au bumps is mounted on a flexible circuit board by connecting the former to the latter with an Au/Sn eutectic alloy. The flexible circuit board is a circuit board that is formed by sticking copper foil to a polyimide film, forming a circuit by photolithography, and then plating the circuit with Sn. The ACF is a film that is configured in such a manner that plastic particles plated with Ni/Au, Ni particles, or the like are dispersed in an insulative resin such as an epoxy resin. With this method, if a display failure such as a line defect is found in a dynamic operating inspection that is performed after the TCP has been connected to the peripheral portion of the substrate, it can easily be judged whether the cause of the display failure exists in the driver LSI or a wiring or switching elements formed on the circuit board by bringing a prober that is connected to an oscilloscope to copper-foil-exposed tip portions of an output terminal array of the TCP and measuring output waveforms of the driver LSI. Further, the cause of a failure of the driver LSI can be determined by analyzing the measured waveforms of the driver LSI, which makes it possible to increase the yield of driver LSI products and thereby provide inexpensive liquid crystal display devices.

On the other hand, in recent years, the COG (chip on glass) method has come to be employed increasingly as a lower-cost manufacturing method of a liquid crystal display device. A method of connecting a driver LSI and external circuits to an electrode terminal portion of a general liquid crystal display device by using the COG method will be described below with reference to FIG. 9. First, an ACF 10 is stuck to electrode terminals 17 that are formed on the surface of the peripheral portion of an electrode substrate 1. After Au bump electrodes 3*a* and 3*b* that are formed on the back face of a driver LSI 3 are brought into accurate alignment with the electrode terminals 17, thermo-compression bonding is performed by using a heating/pressurizing tool under conditions that the heating temperature is 170–200° C., the bonding time is 10–20 seconds, and the pressure is 30–100 Pa. As a result, vertical continuity is established by conductive particles 10*a* of the ACF 10 that are interposed between the bump electrodes 3*a* and 3*b* of the driver LSI 3 and the electrode terminals 17. Horizontal insulation is maintained because an insulative epoxy resin 10*b* exists around the conductive particles 10*a*. In this manner, the driver LSI 3 is directly mounted on the electrode terminals 17. Further, to transmit drive signals and power from the external circuit board to the driver LSI 3, an FPC (flexible printed circuit) 9 is connected to the electrode terminals 17 in a similar manner.

Where the above-described COG method is employed, the bump electrodes 3*a* and 3*b* of the driver LSI 3 exist on the back face of the driver LSI 3 and are surrounded by the ACF 10. If a display failure such as a line defect occurs in a dynamic operating inspection that is performed in this state, that is, after the mounting of the driver LSI 3, output waveforms of the driver LSI 3 cannot be measured. Therefore, it cannot be determined whether the cause of the display failure exists in the driver LSI 3 or a wiring or switching elements formed on the electrode substrate 1. This makes it impossible to take an effective measure against the failure and hence makes it difficult to increase the yield.

To solve the above problem, JP-A-9-26591, for example, proposes a liquid crystal display device in which electrodes for connection to a driver LSI and test pads for contact with a prober are separately provided on an output wiring that is formed on a substrate surface. However, in this case, it is difficult to secure an area where to form test pads when the number of output terminals of a driver LSI is large. Securing such an area is a factor of obstructing the narrowing of the frame portion of a liquid crystal display device.

Another method for solving the above problem is known. In connecting a driver LSI to electrode terminals using an ACF, thermo-compression bonding is performed for such a short time that the resin in the ACF reacts only slightly. A dynamic operating inspection is performed thereafter. Thermo-compression bonding is performed again for a sufficient time only if a test result is good. If a display failure is found, the driver LSI is removed immediately and replaced by another one. However, this method is disadvantageous in making the process complex and lowering the productivity.

SUMMARY OF THE INVENTION

The present invention has been made to solve the above problem, and an object of the invention is therefore to provide, in a liquid crystal display device that employs the COG method, a structure that makes it possible to easily determine the cause of a display failure such as a line defect as well as a related testing method, thereby obtaining a liquid crystal display device that is inexpensive and high in productivity.

A liquid crystal display device according to a first aspect of the invention comprises a display unit, a driving line array, a driver IC and at least one cross line. The display unit includes two insulative substrates opposed to each other and a liquid crystal layer interposed between the two insulative substrates for forming liquid crystal display elements. The driving line array is formed on a peripheral portion of one of the two insulative substrates and including driving lines that are connected to the respective liquid crystal display elements. The driver IC is mounted on the peripheral portion, for driving the liquid crystal display elements, the driver IC having input bumps for receiving input signals from an external circuit board and output bumps that are joined to the respective driving lines. And the one cross line is formed on the peripheral portion so as to cross the driving line array with an insulating film interposed in between, the cross line has an electrode with which a prober can come into contact.

According to the first aspect of the invention, if a display failure such as a line defect is found in a dynamic operating inspection that is performed after mounting of the driver IC, a crossing portion of the cross line and a driving line as a failure occurring position is irradiated with laser light, whereby the driving line concerned and the cross line are connected to each other. An output waveform of the driver IC flowing through the driving line concerned can be measured via the cross line by contacting a prober into contact with the electrode. In this manner, the cause of a display failure can be investigated easily, which makes it possible to provide a liquid crystal display device that is inexpensive and high in productivity.

A liquid crystal display device according to a second aspect of the invention comprises a display unit, at least two cascade-connected ICs, a connection line array and at least one cross line. The display unit includes two insulative substrates opposed to each other and a liquid crystal layer interposed between the two insulative substrates for forming liquid crystal display elements. The two cascade-connected driver ICs include first and second driver ICs mounted on a peripheral portion of one of the two insulative substrates, for driving the liquid crystal display elements. The first driver IC has an output bump array for outputting output signals that are supplied to the respective liquid crystal display elements. The second driver IC has an input bump array for receiving the output signals from the first driver IC. The connection line array is formed on the peripheral portion and includes connection lines that connect the output bump array of the first driver IC to the input bump array of the second driver IC. The one cross line is formed on the peripheral portion so as to cross the connection line array with an insulating film interposed in between, the cross line having an electrode with which a prober can come into contact.

According to the second aspect of the invention, if a display failure such as a line defect is found in a dynamic operating inspection that is performed after mounting of the driver ICs, a crossing portion of the cross line and a connection line as a failure occurring position is irradiated with laser light, whereby the connection line concerned and the cross line are connected to each other. An output waveform of the first driver IC flowing through the connection line concerned can be measured via the cross line by contacting a prober into contact with the electrode. In this manner, the cause of a display failure can be investigated easily, which makes it possible to provide a liquid crystal display device that is inexpensive and high in productivity.

A third aspect of the invention provides a testing method for determining a cause of a display failure such as a line defect when it has occurred in a manufacturing process of a liquid crystal display device. The liquid crystal display device comprises a display unit, a driving line array, a driver IC and at least one cross line. The display unit includes two insulative substrates opposed to each other and a liquid crystal layer interposed between the two insulative substrates for forming liquid crystal display elements. The driving line array is formed on a peripheral portion of one of the two insulative substrates and includes driving lines that are connected to the respective liquid crystal display elements. The driver IC is mounted on the peripheral portion, for driving the liquid crystal display elements, the driver IC has output bumps that are joined to the respective output lines. The one cross line is formed on the peripheral portion so as to cross the output line array with an insulating film interposed in between, the cross line has an electrode with which a prober can come into contact. The testing method comprises the steps of determining an address of a position where the display failure has occurred; irradiating a crossing portion of the cross line and the driving line corresponding to the determined address with laser light, and thereby connecting the cross line and the driving line for that crossing portion; and contacting a prober that is connected to an oscilloscope into contact with the electrode of the cross line and thereby measuring an output waveform of the driver IC flowing through the driving line via the cross line and the electrode.

According to the third aspect of the invention, a test process is executed that includes the steps of determining an address of a position where a display failure has occurred; irradiating a crossing portion of the cross line and the driving line corresponding to the determined address with laser light, and thereby connecting the cross line and the driving line for that crossing point; and contacting a prober that is connected to an oscilloscope into contact with the electrode of the cross line and thereby measuring an output waveform of the driver IC flowing through the driver line via the cross line and the electrode. Therefore, when a display failure such as a line defect has occurred in a manufacturing process of a liquid crystal display device having driving lines and a cross line, the cause of the display failure can be determined.

A fourth aspect of the invention provides a testing method for determining a cause of a display failure such as a line defect when it has occurred in a manufacturing process of a liquid crystal display device. The liquid crystal display device comprises a display unit, at least two cascade-connected driver ICs, a connection line array and at least one crossing line. The display unit includes two insulative substrates opposed to each other and a liquid crystal layer interposed between the two insulative substrates for forming liquid crystal display elements. The two cascade-connected driver ICs include first and second driver ICs. The two cascade-connected driver ICs are mounted on a peripheral portion of one of the two insulative substrates, for driving the liquid crystal display elements. The first driver IC has an output bump array for outputting output signals that are supplied to the respective liquid crystal display elements. The second driver IC has an input bump array for receiving the output signals from the first driver IC. The connection line array is formed on the peripheral portion and includes connection lines that connect the output bump array of the first driver IC to the input bump array of the second driver IC. The one cross line is formed on the peripheral portion so as to cross the connection line array with an insulating film interposed in between, the cross line has an electrode with which a prober can come into contact. The testing method comprises the steps of determining one connection line in the connection line array connected to one liquid crystal display element that the display failure has occurred; irradiating one crossing portion of the cross line and the one connection line with laser light, and thereby connecting the cross line and the connection line for the one crossing portion; and contacting a prober that is connected to an oscilloscope into contact with the electrode of the cross line and thereby measuring an output waveform of the driver IC flowing through the connection line via the cross line and the electrode.

According to the fourth aspect of the invention, a test process is executed that includes the steps of determining one connection line in the connection line array connected to one liquid crystal display element that the display failure has occurred; irradiating one crossing portion of the cross line and the one connection line with laser light, and thereby connecting the cross line and the connection line for the one crossing portion; and contacting a prober that is connected to an oscilloscope into contact with the electrode of the cross line and thereby measuring an output waveform of the driver IC flowing through the one connection line via the cross line and the electrode. Therefore, when a display failure such as a line defect has occurred in a manufacturing process of a liquid crystal display device of such a type as to have connection lines that connect the output bumps of a first driver IC and the input bumps of a second driver IC, the cause of the display failure can be determined.

DESCRIPTION OF THE PREFERRED EMBODIMENTS

Embodiment 1

Figure 1:
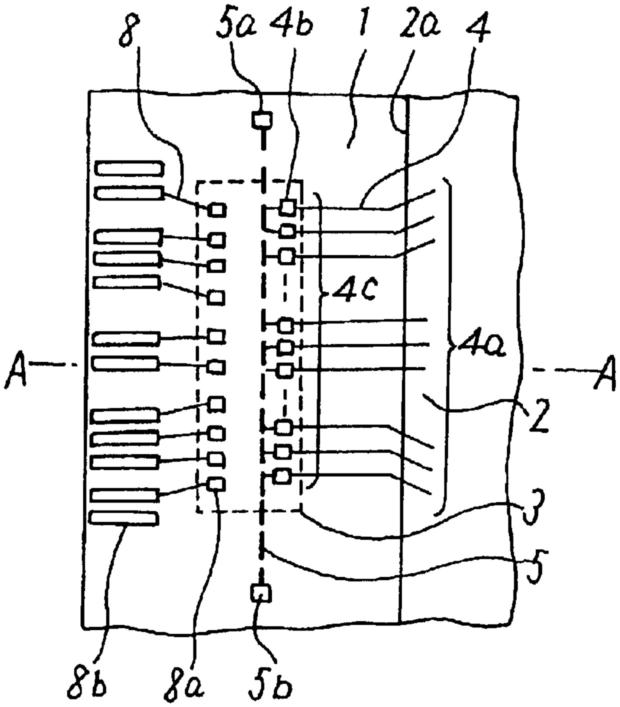
FIG. 1 is a partial plan view showing an electrode terminal portion of a liquid crystal display device according to a first embodiment of the present invention.
Figure 2:
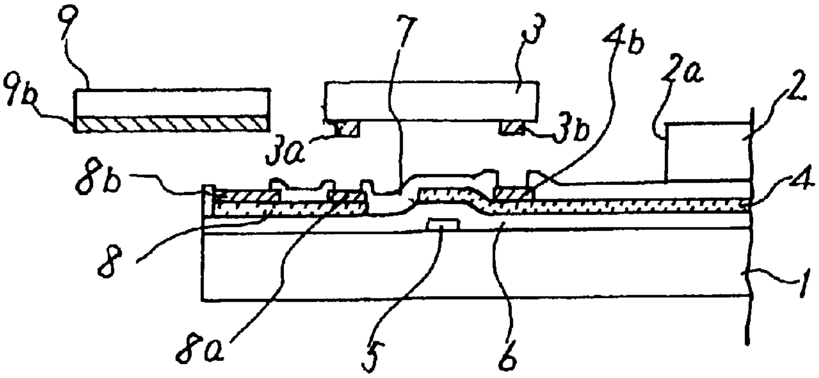
FIG. 2 is a partial sectional view taken along line A—A in FIG. 1.

A first embodiment of the present invention will be hereinafter described with reference to the drawings. FIG. 1 is a partial plan view showing an electrode terminal portion of a liquid crystal display device according to the first embodiment of the invention. FIG. 2 is a partial sectional view taken along line A—A in FIG. 1. The liquid crystal display device according to this embodiment employs inverted staggered structure transistors using amorphous silicon (hereinafter referred to as "a-Si") as a semiconductor layer and is mounted with a driver LSI on the peripheral portion of a substrate by using the COG method.

First, structure of the liquid crystal display device will be described briefly. The liquid crystal display device is equipped with a display unit in which liquid crystal display elements are formed by interposing a liquid crystal layer between two insulative substrates that are opposed to each other, that is, an electrode substrate 1 and a counter substrate 2. Gate lines and source lines, thin-film transistors as switching elements that are arranged close to the crossing points of the gate lines and source lines, pixel electrodes that are connected to the respective thin-film transistors (none of those lines, elements, electrodes are shown in FIGS. 1 and 2), etc. are arranged in matrix form on the display unit portion of the electrode substrate 1. A counter electrode that is a transparent conductive film, color filter layers for color display, and a black matrix that occupies the space excluding the pixels (none of those are shown in FIGS. 1 and 2), etc. are formed on the display unit portion of the counter substrate 2. The electrode substrate 1 and the counter substrate 2 are opposed to each other with the liquid crystal layer and spacers interposed in between and connected to each other with a sealing material.

An electrode terminal portion is formed on the peripheral portion that surrounds the display unit portion of the electrode substrate 1, and a driver LSI 3 as a driver IC for driving the liquid crystal display elements is mounted on the display unit portion. The structure of a source-side electrode terminal portion will be described below. A source line array **4*a* including source lines 4 as output driving lines that are connected to the liquid crystal display elements in the display unit is arranged on the peripheral portion of the electrode substrate 1. Source electrode terminals 4*b* to be joined to respective output bumps 3*b* of the driver LSI 3 are formed at tip portions of the source lines 4, respectively. The source electrode terminals 4*b* are arranged close to each other in the same number as the number of output bumps 3*b* of the driver LSI 3 and thus form a source electrode terminal block 4*c*. A single cross line 5 is formed between the array of input bumps 3*a* and the array of output bumps 3*b* of the driver LSI 3 in a state that the driver LSI 3 is mounted. The cross line 5 belongs to a different metal-line layer than the source lines 4 do; in this embodiment, the cross line 5 belongs to the same metal-line layer as the gate lines do. Therefore, the cross line 5 crosses the source line array 4*a* with a gate insulating film 6 interposed in between. The cross line 5 has, at both ends, cross line electrodes 5*a* and 5*b* with which a test prober can come into contact. The cross line electrodes 5*a* and 5*b* are wider than the connecting lines connected to the cross line electrodes 5*a*, 5*b* of the cross line 5 and is not covered with (i.e., exposed through) the gate insulating film 6 or a passivation film 7**.

Input lines 8 for the driver LSI 3 are formed on an outermost portion of the peripheral portion of the electrode substrate 1 so as to belong to the same metal-line layer as the source line array **4*a* does. LSI electrodes 8*a* to be connected to respective input bumps 3*a* of the driver LSI 3 are formed at one ends of the input lines 8, respectively, and FPC electrodes 8*b* to be connected to an FPC (flexible printed circuit) 9 for supplying drive signals and power from an external circuit board to the driver LSI 3 are formed at the other ends of the input lines 8**, respectively.

Next, a manufacturing method of the electrode substrate 1 that is part of a manufacturing method of the liquid crystal display device according to this embodiment will be described. First, a metal film of Cr, Al, Ta, Ti, Mo, or the like is formed on a transparent insulative substrate such as a glass plate (e.g., a trade name AN635) by sputtering and then patterned by photolithography, whereby a cross line 5, cross line electrodes **5*a* and 5*b*, gate electrodes and gate lines in the display unit, gate terminal electrodes of the electrode terminal portion, electrode terminals for capturing external input signals, etc. are formed at the same time. Then, a gate insulating film 6 (e.g., an SiN film) is formed by plasma CVD. Subsequently, an a-Si layer to serve as channel layers and an $N^+$ a-Si layer to serve as contact layers are formed successively on the gate electrodes and the gate insulating film 6 and then patterned, whereby thin-film transistors for driving liquid crystal display elements in the display unit portion are formed. Then, a metal film of Cr, Al, Mo, or the like is formed by sputtering and then patterned, whereby drain electrodes, source lines, and source electrodes in the display unit portion, a source line array 4***a* of the electrode terminal portion, input lines 8 for capturing external input signals, etc. are formed at the same time. Subsequently, an ITO film is formed by sputtering and then patterned, whereby pixel electrodes are formed. An ITO film is formed at the same time on the gate electrode terminals, the source electrode terminals 4*b*, the LSI electrodes 8*a* and the FPC electrodes 8*b* of the input lines 8 in the electrode terminal portion to prevent a phenomenon that an oxide film is formed by exposure of the surface of an electrode terminal that is made of the wiring material of Cr, Al, or the like and causes a failure in the continuity with an ACF. Then, to prevent a DC-component-inducing material from entering the liquid crystal layer, a passivation film 7 (e.g., an SiN film) is formed by plasma CVD. Finally, portions of the passivation film 7 on the gate electrode terminals, the source electrode terminals 4*b*, and the LSI electrodes 8*a* and the FPC electrodes 8*b* of the input lines 8 are remove to expose the ITO film there. The electrode substrate 1 according to this embodiment is completed in this manner. A manufacturing method of the counter substrate 2, an assembling process of bonding the electrode substrate 1 and the counter substrate 2 to each other and injecting a liquid crystal, and other manufacturing methods and processes will not be described.

Figure 3:
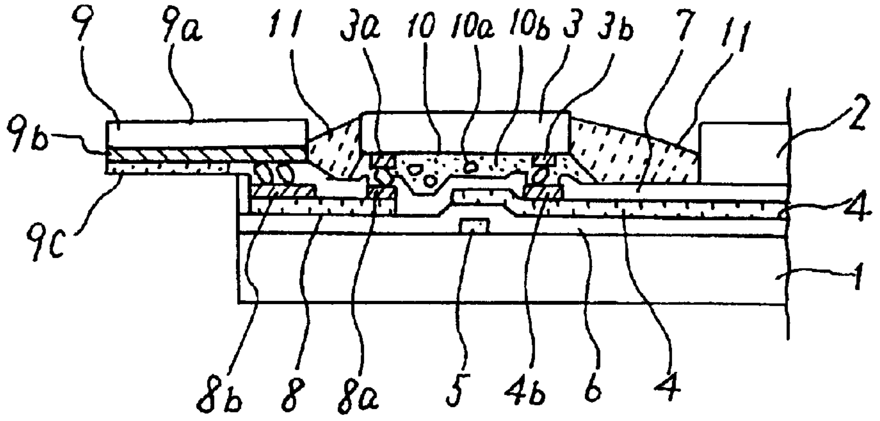
FIG. 3 is a partial sectional view illustrating a mounting method of a driver LSI of the liquid crystal display device of FIGS. 1 and 2.

Next, a mounting method of the driver LSI 3 will be described with reference to FIG. 3. First, an ACF (anisotropic conductive film) 10 is stuck to the LSI electrodes 8*a* and the source electrode terminals 4*b* that are formed on the surface of the peripheral portion of the electrode substrate 1. After the input bumps 3*a* and the output bumps 3*b* of the driver LSI 3 are brought into accurate alignment with the LSI electrodes 8*a* and the source electrode terminals 4*b*, respectively, thermo-compression bonding is performed by using a heating/pressurizing tool under conditions that the heating temperature is 170–200° C., the bonding time is 10–20 seconds, and the pressure is 30–100 Pa. As a result, vertical continuity is established by conductive particles 10*a* of the ACF 10 that are interposed between the input bumps 3*a* of the driver LSI 3 and the LSI electrodes 8*a* and between the output bumps 3*b* of the driver LSI 3 and the source electrode terminals 4*b*. That is, the input bumps 3*a* and the output bumps 3*b* of the driver LSI 3 are electrically connected to the LSI electrodes 8*a* and the source electrode terminals 4*b*, respectively. Horizontal insulation is maintained because an insulative epoxy resin 10*b* exists around the conductive particles 10*a*. Then, the FPC 9 is connected to the FPC electrodes 8*b* in the same manner by using an ACF 10. The FPC 9 is composed of a polyimide film 9*a* of about 30–70 μm in thickness, copper foil 9*b* of 8–25 μm in thickness, and a polyimide-based solder resist 9*c*. Finally, an insulating resin 11 is applied to prevent corrosion of the wiring portions between the driver LSI 3 and the end 2*a* of the counter substrate 2 and between the driver LSI 3 and the FPC 9. The insulating resin 11, which is typically a silicone resin, an acrylic resin, a fluororesin, or a urethane resin, is applied by using a dispenser. At this time, the cross line electrodes 5*a* and 5*b*, which have been exposed through the passivation film 7, are covered with the insulating resin 11.

Figure 4:
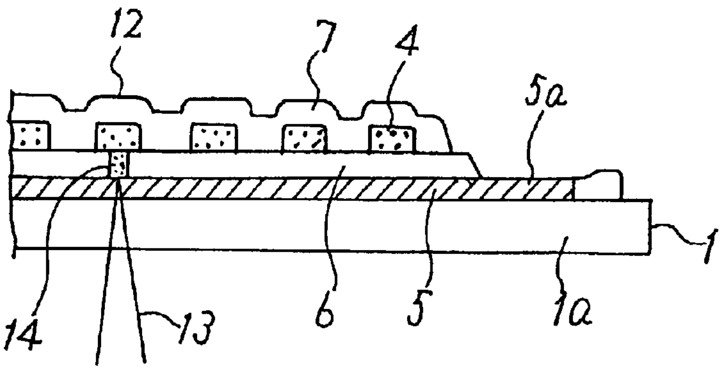
FIG. 4 is a partial sectional view illustrating a testing method that is used when a display failure occurs in the liquid crystal display device of FIGS. 1 and 2.
Figure 5:
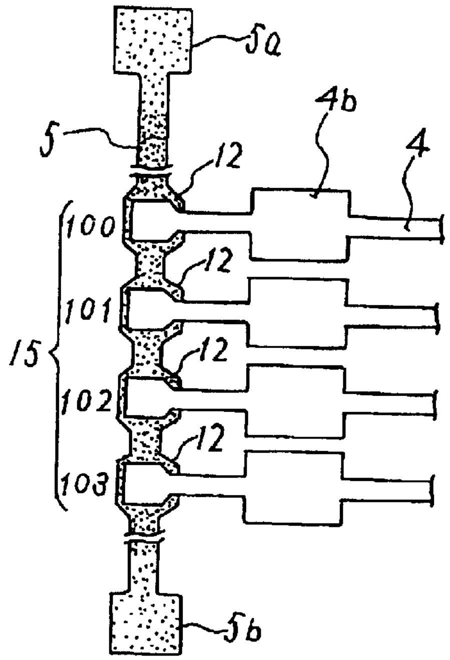
FIG. 5 is a partial plan view showing an alternative structure of crossing portions of a cross line and source lines in the liquid crystal display device of FIGS. 1 and 2.

Next, a testing method that is used when a display failure occurs in the liquid crystal display device according to this embodiment will be described with reference to FIGS. 4 and 5.

A dynamic operating inspection in which it is checked whether a prescribed video signal is obtained in the display unit by sequentially inputting signals to the respective source lines 4 from a signal generator is performed on the liquid crystal display panel that has been mounted with the driver LSI 3 and the FPC 9. An address of a position where the prescribed video signal was not obtained in the display unit, that is, a position where a display failure such as a line defect was found is determined by an address-determining function of the signal generator. Then, as shown in FIG. 4, a crossing portion 12 of the cross line 5 and a source line 4 corresponding to the thus-determined address is irradiated with YAG laser light 13 from the back side of the electrode substrate 1, that is, from the glass substrate 1*a* side. The gate insulating film 6 is broken through by the heat of the laser light 13, whereby the source line 4 and the cross line 5 are short-circuited with each other and electrically connected with each other (in FIG. 4, reference symbol 14 denotes a short-circuiting portion between the source line 4 and the cross line 5). In this case, to obtain electrical continuity reliably, it is desirable to perform laser light irradiation plural times. It is also effective to make the cross line 5 and the source lines 4 wider in the crossing portions 12 than in the other connecting portions connected the crossing portions 12 as shown in FIG. 5 to thereby secure sufficiently wide irradiation areas. Further, to easily identify a portion to be irradiated with laser light, address numbers 15 of the respective source lines 4 may be written at positions very close to the crossing portions 12. The address numbers 15 may be formed by using the source line material, the cross line material, or a-Si. Dots, symbols, or the like may be used instead of the address numbers 15.

Subsequently, the portion of the insulating resin 11 covering the cross line electrode 5*a* (or 5*b*) is removed. Where the insulating resin 11 is an acrylic resin, the intended portion of the insulating resin 11 can easily be wiped off with a cotton swab that is soaked with acetone. Then, a prober that is connected to an oscilloscope is brought into contact with the cross line electrode 5*a* (or 5*b*), whereby an output waveform that is output from the output bump 3*b* of the driver LSI 3 that is connected to the source electrode terminal 4*b* of the source line 4 as the failure occurring position via the cross line 5 is measured and the cross line electrode 5*a* (or 5*b*) and the cause of the failure is investigated. Specifically, a dynamic operating inspection is performed again in the state that the prober that is connected to the oscilloscope is in contact with the cross line electrode 5*a* (or 5*b*), and it is determined based on the respective waveforms whether the cause of the failure is an output abnormality of the driver LSI 3, disconnection of a line that is formed on the electrode substrate 1, an abnormality of a TFT, or the like.

Figure 6:
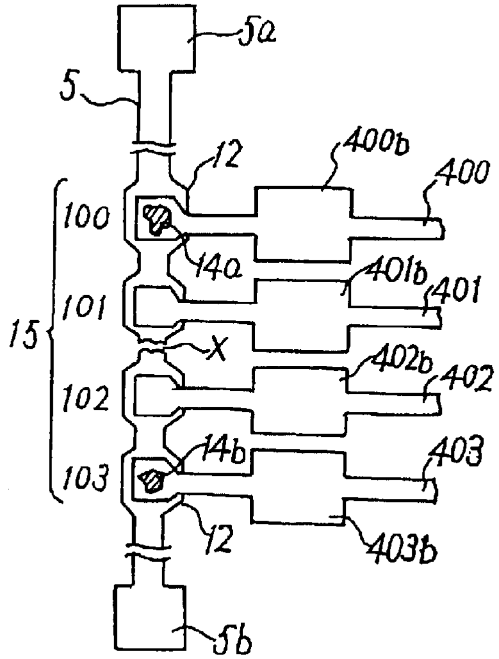
FIG. 6 is a partial sectional view illustrating a testing method that is used when a plurality (two) of display failures occur in the liquid crystal display device of FIGS. 1 and 2.

Although in this embodiment the cross line electrodes 5*a* and 5*b* are formed at the two respective ends of the cross line 5, only one cross line electrode may be formed at one end of the cross line 5. However, to accommodate a case that a plurality of display failures occur simultaneously, it is desirable that cross line electrodes be formed at a plurality of locations. An exemplary testing method that is used when two display failures occur will be described with reference to FIG. 6. As shown in FIG. 6, when line defects have occurred in two source lines 400 and 403, a portion (e.g., a portion indicated by a mark “X” in FIG. 6) of the cross line 5 that is located between the source lines 400 and 403, and is located in neither of the crossing portions 12 of the cross line 5 and the source lines 401 and 402 is irradiated with YAG laser light from the glass substrate side and thereby dissolved, whereby the cross line 5 is cut there. The cross line 5 is divided into two lines having the cross line electrodes 5*a* and 5*b* at the other ends, respectively. Then, crossing portions 12 of the cross line 5 and the source lines 400 and 403, that is, the crossing portions whose address numbers 15 are 100 and 103, are irradiated with YAG laser light from the glass substrate side. Holes are formed there through the gate insulating film 6, whereby the source lines 400 and 403 are short-circuited with the cross line 5 (in FIG. 6, reference symbols 14*a* and 14*b* denote short-circuiting portions). Then, a dynamic operating inspection is performed in a state that a prober is in contact with the cross line electrode 5*a*, and an output waveform that is output from the output bump 3*b* of the driver LSI 3 that is connected to the source electrode terminal 400*b* is observed. Similarly, the prober is brought into contact with the cross line electrode 5*b* and an output waveform that is output from the output bump 3*b* of the driver LSI 3 that is connected to the source electrode terminal 403*b* is measured. The causes of the failures are determined based on the respective waveforms.

Figure 7:
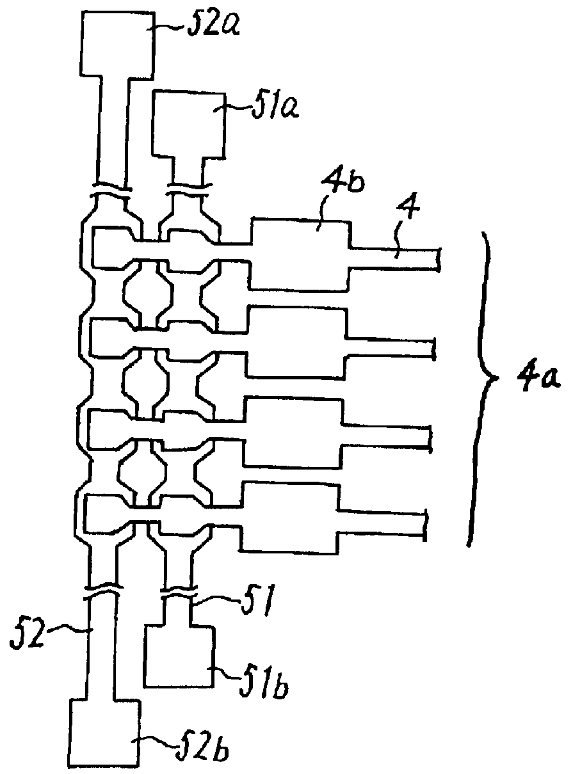
FIG. 7 is a partial plan view showing an example in which two cross lines are formed in the liquid crystal display device of FIGS. 1 and 2.

To accommodate even more disconnections, a plurality of cross lines 5 may be formed. FIG. 7 shows an example in which two cross lines 51 and 52 are formed approximately parallel with each other so as to cross the source line array 4*a* and in which cross line electrodes 51*a* and 51*b* are formed at both ends of the cross line 51 and cross line electrodes 52*a* and 52*b* are formed at both ends of the cross line 52. This example can accommodate up to four display failures such as line defects. Although not shown in any drawings, other modifications are possible. For example, the cross line 5 may be branched and cross line electrodes may be formed at the ends of respective branches. Cross line electrodes may be formed at positions of the cross line 5 other than its ends. Further, the effectiveness of the cross line 5 is not lowered at all even if it is not straight. In this embodiment, to enable narrowing of the frame portion of the liquid crystal display device, the cross line 5 is formed between the array of input bumps 3*a* and the array of output bumps 3*b* of the driver LSI 3. However, the cross line 5 may be formed at any position as long as it crosses the source line array 4*a*. For example, the cross line 5 may be formed between the driver LSI 3 and the end 2*a* of the counter substrate 2.

As described above, according to this embodiment, in the liquid crystal display device that employs the COG method, the single cross line 5 having cross line electrodes 5*a* and 5*b* at both ends is formed on the surface of the peripheral portion of the electrode substrate 1 so as to cross the source line array 4*a* with the gate insulating film 6 interposed in between. If a display failure such as a line defect is found in a dynamic operating inspection that is performed after mounting of the driver LSI 3, a crossing portion 12 of the cross line 5 and a source line 4 as a failure occurring position is irradiated with YAG laser light from the back side of the electrode substrate 1, whereby the source line 4 concerned and the cross line 5 are connected to each other. An output waveform of the driver LSI 3 flowing through the source line 4 as the failure occurring position can be measured by bringing a prober that is connected to an oscilloscope into contact with the cross line electrode 5*a* (or 5*b*). In this manner, the cause of a display failure can be investigated easily, which makes it possible to provide a liquid crystal display device that is inexpensive and high in productivity. Since the cross line 5 can be formed simultaneously with the gate lines, it is not necessary to increase the number of manufacturing steps from that in conventional liquid crystal display devices. Further, since the cross line 5 is formed between the array of input bumps 3*a* and the array of output bumps 3*b* of the driver LSI 3, it is not necessary to secure a space where to form the cross line 5. This enables narrowing of the frame portion of the liquid crystal display device.

Embodiment 2

Figure 8:
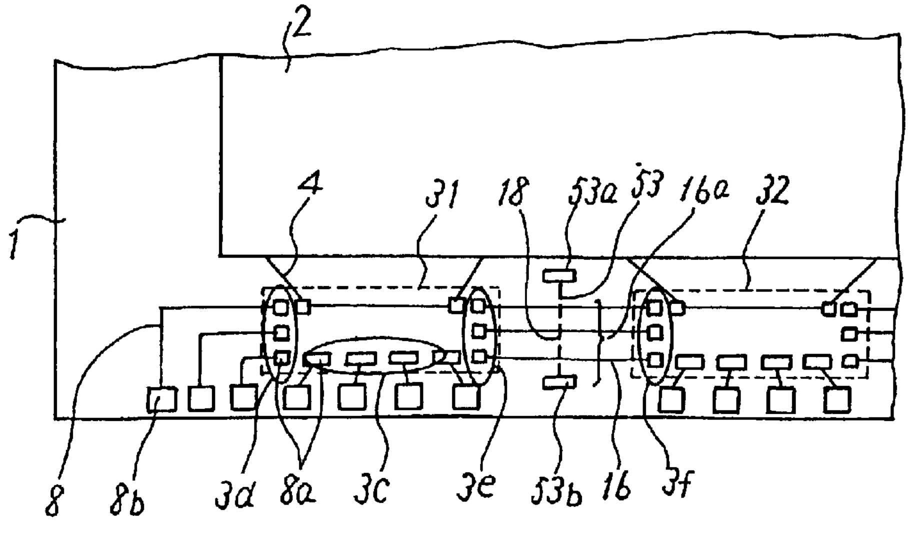
FIG. 8 is a partial plan view showing an electrode terminal portion of a liquid crystal display device according to a second embodiment of the invention.
Figure 9:
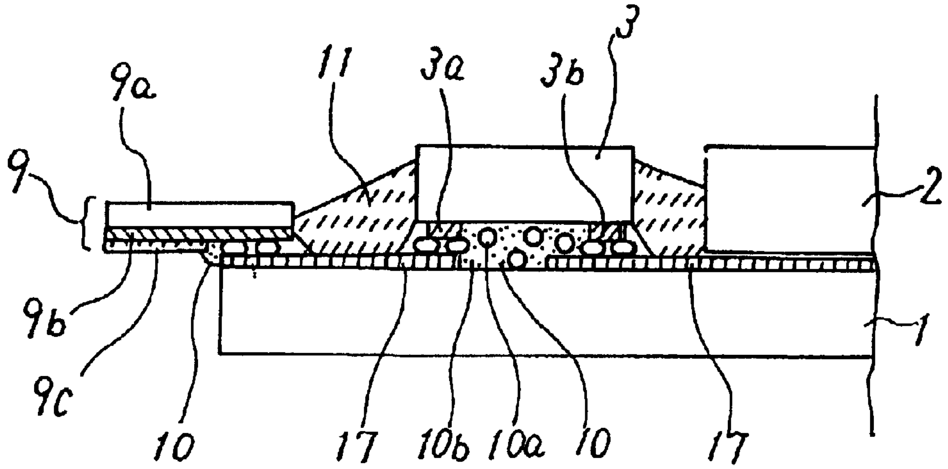
F I G. 9 PRIOR ART
FIG. 9 shows method of connecting a driver LSI and external circuits to an electrode terminal portion of a general liquid crystal display device by using the COG method.

A second embodiment of the invention is directed to a case that a cross line is used in a liquid crystal display device in which a plurality of cascade-connected driver LSIs are mounted on one side portion of the peripheral portion of the electrode substrate. FIG. 8 is a partial plan view showing a source-side electrode terminal portion of a liquid crystal display device according to a second embodiment of the invention. Items in FIG. 8 having the same or corresponding items in FIGS. 1 and 2 are given the same reference symbols as the latter and will not be described.

In the liquid crystal display device according to this embodiment, a plurality of cascade-connected driver LSIs, that is, a first driver LSI 31, a second driver LSI 32, etc. (indicated by broken lines in FIG. 8), are mounted on the surface of a one side portion of the peripheral portion of the electrode substrate 1. Among those driver LSIs, the first driver LSI 31 that is located at one end is supplied with drive signals and power from an external circuit board via an FPC (not shown). As shown in FIG. 8, the driver LSI 31 has a power bump array 3*c*, an input signal bump array 3*d*, and an output bump array 3*e* for outputting input signals to the second driver LSI 32 in a long-side portion, one short-side portion, and the other short-side portion, respectively. The second driver LSI 32 that is connected to the first driver LSI 31 has input bump array 3*f* for receiving input signals.

In this embodiment, connection line array 16*a* including connection lines 16 that connect the output bump array 3*e* of the first driver LSI 31 to the input bump array 3*f* of the second driver LSI 32 is formed on the surface of the peripheral portion of the electrode substrate 1. The connection line array 16*a* is made of the same material as the source lines 4 are. A cross line 53 (indicated by a broken line in FIG. 8) is formed between the output bump array 3*e* of the first driver LSI 31 and the input bump array 3*f* of the second driver LSI 32. The cross line 53 is formed in a different metal-line layer than the connection line array 16*a* is; in this embodiment, the cross line 53 is formed in the same metal-line layer as the gate lines are. Therefore, the cross line 53 crosses the connection line array 16*a* with the gate insulating film interposed in between. The cross line 53 has, at both ends, cross line electrodes 53*a* and 53*b* with which a test prober can come into contact. The cross line electrodes 53*a* and 53*b* are wider than the connecting lines connected to the cross line electrodes 53*a*, 53*b* of cross line 53 and is not covered with (i.e., exposed through) the gate insulating film 6 or the passivation film 7. The cross line 53 and the connection line array 16*a* are wider in their crossing portions 18 than in the other connecting portions connected to the crossing portions 18. Numerals or symbols indicating addresses of the respective connection lines 16 of the connection line array 16*a* may be written at positions close to the crossing portions 18 of the cross line 53 and the connection line array 16*a*. The method of forming the electrode substrate 1 and the method of mounting the driver LSIs in this embodiment are the same as in the first embodiment and hence will not be described.

Next, a testing method that is used when a display failure occurs in the liquid crystal display device according to the invention will be described below briefly. If a display failure such as a line defect is found in a dynamic operating inspection that is performed after mounting of the driver LSIs 31, 32, etc. and the FPC, in particular, if a display failure is found in the block of the driver LSIs 31 and 32, a connection line 16 that connects an output bump of the first driver LSI 31 relating to a failure occurring position and the associated input bump of the second driver LSI 32 is determined. Then, the cross line portion 18 of the thus-determined connection line 16 and the cross line 53 is irradiated with YAG laser light from the back side (i.e., the glass substrate side) of the electrode substrate 1, whereby the connection line 16 and the cross line 53 are connected to each other. A portion of the insulating resin covering the cross line electrode 53*a* (or 53*b*) is removed. Subsequently, a prober that is connected to an oscilloscope is brought into contact with the cross line electrode 53*a* (or 53*b*) and an output waveform of the first driver LSI 31 flowing through the connection line 16 is measured via the cross line 53. The cause of the failure is determined based on a waveform that appears on the oscilloscope. In this manner, this embodiment provides the same advantages as the first embodiment does.

Although each of the first and second embodiments is directed to the source-side electrode terminal portion, the invention can similarly be applied to the gate-side electrode terminal portion. In the latter case, it is appropriate to form a cross line in the same metal-line layer as the source lines are formed, so as to cross the gate line array with the gate insulating film interposed in between.

Additional features of the liquid crystal display devices according to the first and second aspects of the invention are as follows.

A first additional feature is such that the cross line and the lines of the output line array or the connection line array are wider in their crossing portions than in the other connecting portions connected to the crossing portions. This makes it possible to secure a sufficient area of a portion that should be irradiated with laser light when a display failure occurs and thereby facilitate laser light irradiation.

A second additional feature is such that numerals or symbols indicating addresses of the output lines or the connection lines are written at each positions close to the crossing portions of the cross line and the output line array or the connection line array, respectively. This makes it possible to easily determine a portion that should be irradiated with laser light when a display failure occurs; laser light can be applied to a correct position reliably.

A third additional feature is such that the cross line is formed between the input bump array and the output bump array of the driver IC. This makes it unnecessary to secure a separate space where the cross line is to be formed. Since the cross line can be formed without increasing the area of the peripheral portion of the one insulative substrate from that in conventional cases, the narrowing of the frame portion of the liquid crystal display device is enabled.

A fourth additional feature is such that the electrode is wider than the connecting line connected to the electrode. This makes it possible to secure a sufficient area of a portion to which a prober is to be brought into contact and thereby facilitate a test.

What is claimed is:

1. A liquid crystal display device comprising:

a display unit including two insulative substrates opposed to each other and a liquid crystal layer interposed between the two insulative substrates for forming liquid crystal display elements;

a driving line array formed on a peripheral portion of one of the two insulative substrates and including driving lines that are connected to the respective liquid crystal display elements;

a driver IC mounted on the peripheral portion, for driving the liquid crystal display elements, the driver IC having input bumps for receiving input signals from an external circuit board and output bumps that are joined to the respective driving lines; and at least one cross line that is formed on the peripheral portion so as to cross the driving line array with an insulating film interposed in between, the cross line having an electrode with which a prober can come into contact.

2. The liquid crystal display device according to claim 1, wherein the cross line includes crossing portions where the cross line crosses the driving line array and connecting portions between the crossing portions, the width of crossing points are greater than that of the connecting portions.

3. The liquid crystal display device according to claim 1, wherein each driving line of the driving line array includes crossing point where the each driving line crosses the cross line and connecting portion connected to the cross point, and the width of the crossing point of the driving line is greater than that of the connecting portion of the driving line.

4. The liquid crystal display device according to claim 1, wherein the liquid crystal display device includes a plurality of crossing points where the cross line and the each driving line of the driving line array are crossed to each other, numerals are disposed at each position close to the each crossing point, and each of the numerals indicates the address of the each driving line at the each crossing point.

5. The liquid crystal display device according to claim 1, wherein the liquid crystal display device includes a plurality of crossing points where the cross line and the each driving line of the driving line array are crossed to each other, symbols are disposed at each position close to the each crossing point, and each of the symbols indicates the address of the each driving line at the each crossing point.

6. The liquid crystal display device according to claim 1, wherein the cross line is formed between an output bump array including the output bumps of the driver IC and an input bump array including the input bumps of the driver IC.

7. The liquid crystal display device according to claim 1, wherein the electrode is formed at least one end of the cross line and connected to crossing points by a connecting line.

8. The liquid crystal display device according to claim 7, wherein width of the electrode is greater than that of the connecting line of the cross line.

9. A liquid crystal display device comprising:

a display unit including two insulative substrates opposed to each other and a liquid crystal layer interposed between the two insulative substrates for forming liquid crystal display elements;

at least two cascade-connected driver ICs including first and second driver ICs and mounted on a peripheral portion of one of the two insulative substrates, for driving the liquid crystal display elements, the first driver IC having an output bump array for outputting output signals that are supplied to the respective liquid crystal elements, the second driver IC having an input bump array for receiving the output signals from the first driver IC;

a connection line array formed on the peripheral portion and including connection lines that connect the output bump array of the first driver IC to the input bump array of the second driver IC; and at least one cross line that is formed on the peripheral portion so as to cross the connection line array with an insulating film interposed in between, the cross line having an electrode with which a prober can come into contact.

10. The liquid crystal display device according to claim 9, wherein the cross line includes crossing points where the cross line crosses the connection line array and connecting portions between the crossing points, the width of the crossing points are greater than that of the connecting portion.

11. The liquid crystal display device according to claim 9, wherein each connection line of the connection line array includes crossing point where the each connection line crosses the cross line and connecting portion connected to the crossing portion, and the width of the crossing point of the connection line is greater than that of the connecting portion of the connection line.

12. The liquid crystal display device according to claim 9, wherein the liquid crystal display device includes a plurality of crossing points where the cross line and the each connection line of the connection line array are crossed to each other, numerals are disposed at each position close to the crossing point, and each of the numerals indicates the address of the each connection lint at the each crossing point.

13. The liquid crystal display device according to claim 9, wherein the liquid crystal display device includes a plurality of crossing points where the cross line and the each connection line of the connection line array are crossed to each other, symbols are disposed at each position close to the each crossing point, and each of the symbols indicates the address of the each connection line at the each crossing point.

14. A testing method for determining a cause of a display failure such as a line defect when it has occurred in a manufacturing process of a liquid crystal display device comprising a display unit including two insulative substrates opposed to each other and a liquid layer interposed between the two insulative substrates for forming liquid crystal display elements; a driving line array formed on a peripheral portion of one of the two insulative substrates and including driving lines that are connected to the respective liquid crystal display elements; a driver IC mounted on the peripheral portion, for driving the liquid crystal display elements, the driver IC having output bumps that are joined to the respective driving lines; and at least one cross line that is formed on the peripheral portion so as to cross the driving line array with an insulating film interposed in between, the cross line having an electrode with which a prober can come into contact, the testing method comprising the steps of:

determining an address of position where the display failure has occurred;

irradiating a crossing portion of the cross line and the driving line corresponding to the determined address with laser light, and thereby connecting the cross line and the driving line for that crossing portion; and contacting a prober that is connected to an oscilloscope with the electrode of the cross line and thereby measuring an output waveform of the driver IC flowing through the driving line via the cross line and the electrode.

15. A testing method for determining a cause of a display failure such as a line defect when it has occurred in a manufacturing process of a liquid crystal display device comprising a display unit including two insulative substrates opposed to each other and a liquid crystal layer interposed between the two insulative substrates for forming liquid crystal display elements; at least two cascade-connected driver ICs including first and second driver ICs and mounted on a peripheral portion of one of the two insulative substrates, for driving the liquid crystal display elements, the first driver IC having an output bump array for outputting output signals that are supplied to the respective liquid crystal elements, the second driver IC having an input bump array for receiving the output signals from the first driver IC; a connection line array formed on the peripheral portion and including connection lines that connect the output bump array of the first driver IC to the input bump array of the second driver IC; and at least one cross line that is formed on the peripheral portion so as to cross the connection line array with an insulating film interposed in between, the cross line having an electrode with which a prober can come into contact, the testing method comprising the steps of:

determining one connection line in the connection line array connected to one liquid crystal display element that the display failure has occurred;

irradiating one crossing portion of the cross line and the one connection line with laser light, and thereby connecting the cross line and the one connection line for the one crossing portion; and contacting a prober that is connected to an oscilloscope into contact with the electrode of the cross line and thereby measuring an output waveform of the first driver IC flowing through the connection line via the cross line and the electrode.

* * * * *